United States Patent [19]
Iida et al.

[11] Patent Number: 4,528,684
[45] Date of Patent: Jul. 9, 1985

[54] CHARGE-COUPLED DEVICE OUTPUT CIRCUIT

[75] Inventors: Tetsuya Iida; Tatsuo Sakaue, both of Yokohama, Japan

[73] Assignee: Tokyo Shibaura Denki Kabushiki Kaisha, Kawasaki, Japan

[21] Appl. No.: 516,457

[22] Filed: Jul. 22, 1983

[30] Foreign Application Priority Data

Jul. 23, 1982 [JP] Japan .............................. 57-128644

[51] Int. Cl.³ ...................... G11C 19/28; G11C 27/00
[52] U.S. Cl. .......................................... 377/60; 357/24; 333/165
[58] Field of Search ............... 377/60, 61, 62; 357/24; 333/165

[56] References Cited

U.S. PATENT DOCUMENTS

| | | | |
|---|---|---|---|
| 4,151,429 | 4/1979 | Hupe | 333/165 |
| 4,316,100 | 2/1982 | Sakaue et al. | 377/60 |
| 4,476,568 | 10/1984 | Prince | 357/24 |

*Primary Examiner*—John S. Heyman
*Attorney, Agent, or Firm*—Schwartz, Jeffery, Schwaab, Mack, Blumenthal & Evans

[57] ABSTRACT

A circuit for obtaining an output from a CCD type signal processing circuit should operate satisfactorily in a high frequency band covering, for instance, video signals. For this purpose, the floating gate electrode of the CCD is connected to a first potential point through first and second capacitors. The connecting point of the floating gate electrode in the series circuit is connected to a second potential level through a first control switch which is driven by a reset clock pulse, and the connecting point of the first and second capacitors is connected to a third potential level through a second control switch which is driven by a reset clock pulse, so that the output is provided at the connecting point of the capacitors.

4 Claims, 9 Drawing Figures

F I G. 9
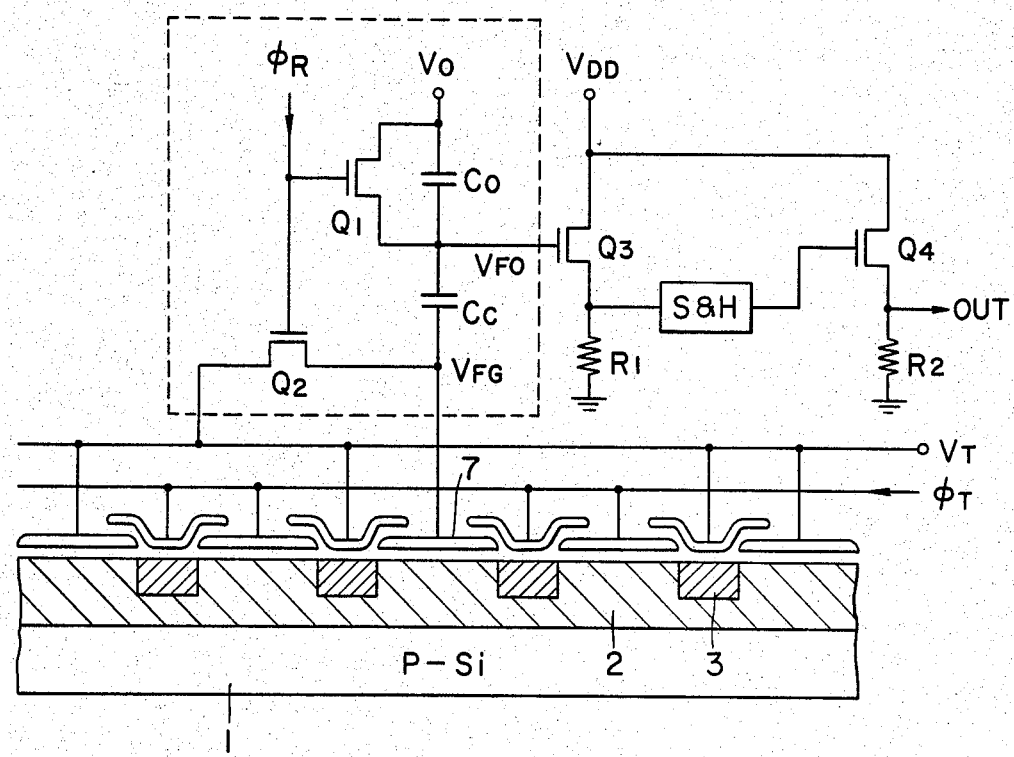

CHARGE-COUPLED DEVICE OUTPUT CIRCUIT

BACKGROUND OF THE INVENTION

This invention relates to the output circuit of a charge-coupled device (hereinafter referred to as "a CCD", when applicable) which is used for a comb filter, delay line, split-electrode type transversal filter, or the like.

A charge detecting method using floating gates have been generally employed to take the output signal of the CCD. For instance, in the case of a double-split electrode type transversal filter, the positive sense line and the negative sense line which are connected to the floating gates of the CCD are connected to input terminals of two operational amplifiers, respectively, the outputs of which are applied to another operational amplifier, so that the difference between these outputs is employed as the output voltage.

The output signal taking method may be used for a low frequency band of the order of 100 KHz, but not for a high frequency band covering video signals or the like. Furthermore, the obtained output DC voltage is always equal to the floating gate reset voltage of the CCD.

SUMMARY OF THE INVENTION

Accordingly, an object of this invention is to eliminate the above-described difficulties accompanying the prior art. More specifically, an object of this invention is to provide a CCD output circuit in which a high frequency band covering video signals or the like can be handled, and the output DC voltage thereof can be changed independently of the CCD floating gate reset voltage.

The foregoing object and other objects of the invention have been achieved by the provision of a charge-coupled device output circuit for detecting an output signal from the amount of charges accumulated below a floating gate electrode; in which, according to the invention, the floating gate electrode is connected in series to a first potential level ($V_{GG}$) point through first and second capacitors, a first connecting point of the floating gate electrode and the first capacitor is connected to a second potential level ($V_T$) point through a first control switch which is driven by a first reset clock pulse ($\phi_{R1}$), and a second connecting point of the first and second capacitors is connected to a third potential level ($V_O$) point through a second control switch which is driven by a second reset clock pulse ($\phi_{R2}$), to detect the output signal at the second connecting point.

In the following detailed description of the invention, for simplification in description, the reset clock pulse for the first control switch is equal to that for the second control switch; however, the invention is not limited thereto or thereby. That is, any pulses may be used which cause the first and second control switches to turn on while the charges below the floating gate electrode are transferred to the next stage.

The nature, principle and utility of the invention will become more apparent from the following detailed description and the appended claims when read in conjunction with the accompanying drawings in which like parts are designated by like reference characters or numerals.

BRIEF DESCRIPTION OF THE DRAWINGS

In the accompanying drawings:

FIG. 9 is an explanatory diagram showing a fourth example of the CCD output circuit according to the invention.

DETAILED DESCRIPTION OF THE INVENTION

As conducive to a full understanding of this invention, first a conventional CCD output circuit will be described.

Figure 1:
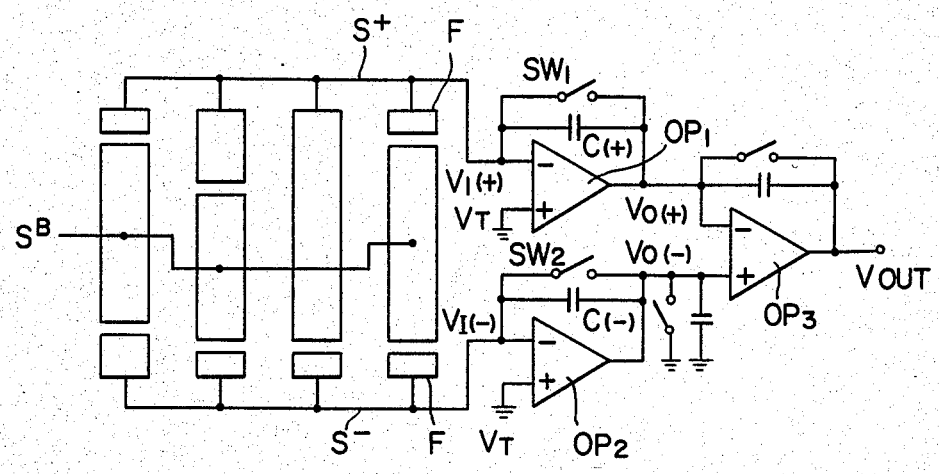
FIG. 1 is a circuit diagram, partly as a block diagram, showing a conventional CCD output circuit.

FIG. 1 is a circuit diagram, partly as a block diagram of one example of the conventional CCD output circuit, showing a transversal filter of double split electrode type using operational amplifiers for detecting charge.

The operation of the CCD output circuit which, as shown in FIG. 1, comprises operational amplifiers $OP_1$, $OP_2$ and $OP_3$ integrating capacitors $C(+)$ and $C(-)$ and switches $SW_1$ and $SW_2$ for detecting output signals, will be described.

When the switches $SW_1$ and $SW_2$ are closed, the output terminal of the amplifier $OP_1$ is connected through the switch $SW_1$ to one input terminal ($-$) thereof, and similarly the output terminal of the amplifier $OP_2$ is connected through the switch $SW_2$ to one input terminal ($-$) thereof. Therefore, the operational amplifiers $OP_1$ and $OP_2$ operate as voltage followers.

Accordingly, the input voltages $V_I(+)$ and $V_I(-)$ of the operational amplifiers $OP_1$ and $OP_2$ and the output voltages $V_O(+)$ and $V_O(-)$ have the following relations:

$$V_I(+)=V_O(-)=V_T$$

$$V_I(-)=V_O(-)=V_T$$

The voltages at the floating gates are set to $V_T$.

When both of the switches $SW_1$ and $SW_2$ are turned off, charges are transferred to the charge accumulating regions of the floating gates F. If the amount of charge in each charge accumulating region is represented by Q, then $$V_O(+)=V_T-Q/C\,(+)$$

$$V_O(-)=V_T-Q/C\,(-)$$

In FIG. 1, reference characters $S+$ and $S-$ designate a positive sense line and a negative sense line, respectively, and $S^B$, a DC voltage signal having a predetermined value.

The output voltages of the operational amplifiers $OP_1$ and $OP_2$ which are obtained from the positive and negative sense lines $S^+$ and $S^-$ as described above, are applied to an operational amplifier $OP_3$ where, they are subjected to subtraction. As a result, the operational amplifier $OP_3$ provides an output voltage $V_{OUT}$.

However, the above-described conventional output circuit using the operational amplifiers is disadvantageous in that the output DC voltage of the output circuit is equal to the reset voltage of the CCD floating gates, and the voltage cannot be changed. Furthermore, the frequency band of an operational amplifier is about 100 KHz in maximum, and in the circuit in FIG. 1 a frequency band handled thereby is not more than several tens of kilo-Hertz.

In the case where a video signal processing CCD filter is designed, an output circuit according to a conventional floating gate charge detecting method using operational amplifiers cannot be employed, because the video signal band is 0 to 4.2 MHz.

Figure 2:
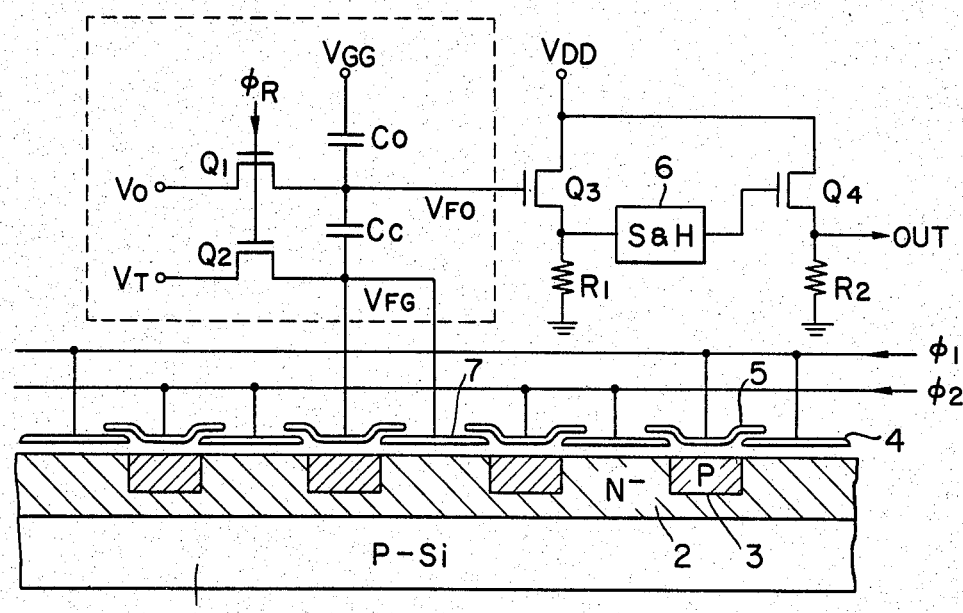
FIG. 2 is an explanatory diagram showing a first exmaple of a CCD output circuit according to this invention.

FIG. 2 shows the arrangement of a first example of a CCD output circuit according to the invention. In the first example, an N channel CCD is made up of a P type silicon substrate 1, an $N^-$ layer 2 formed on the surface of the substrate 1, and $N^{--}$ layers 3 formed in the $N^-$ layer 2. The gate is of a two-layer silicon structure consisting of first and second polysilicon gates 4 and 5. The depletion layer of the second polysilicon gate 5 is shallower than that of the first polysilicon gate 4.

In FIG. 2, reference characters $Q_1$ through $Q_4$ designate N channel MOS transistors; $C_O$ and $C_C$, capacitors (the capacitor $C_O$ may be replaced by a stray capacitance); $R_1$ and $R_2$, resistors; 6, a sample and hold circuit; and $\phi_1$, $\phi_2$ and $\phi_R$, clock signals.

In FIG. 2, the output circuit according to the invention is surrounded by the dotted line. The output voltage $V_{FO}$ of the output circuit is provided, as an output signal, through the MOS transistors $Q_3$ and $Q_4$, the sample and hold circuit 6, and the resistors $R_1$ and $R_2$, namely, a buffer circuit.

Figure 3:
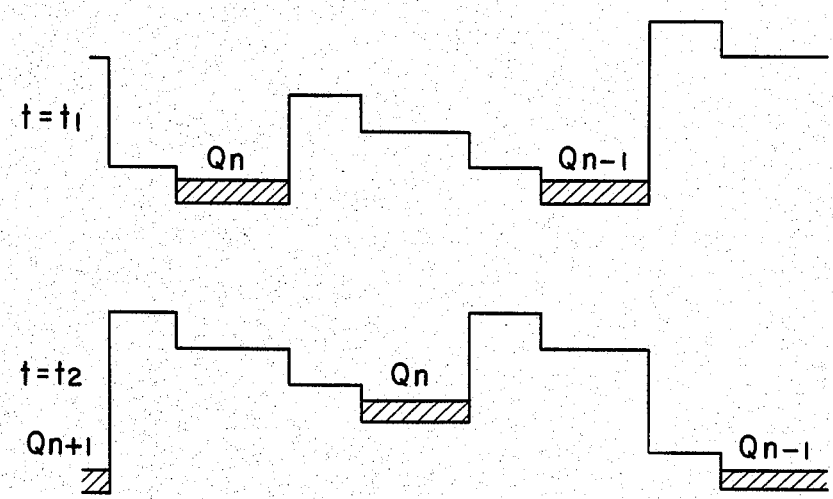
FIG. 3 is a diagram showing potential well distributions in the first example of the CCD output circuit in FIG. 2.
Figure 4:
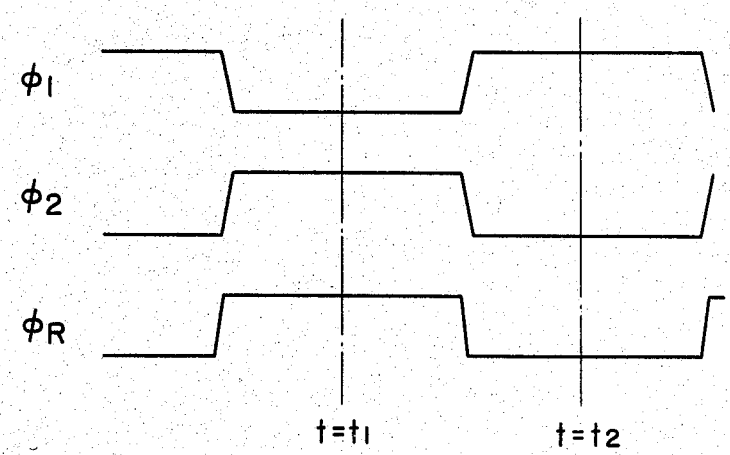
FIG. 4 is a time chart showing clock signals in the CCD output circuit in FIG. 2.

The operation of the first example thus organized will be described with reference to FIGS. 2, 3 and 4. FIG. 3 is a diagram showing the distribution of potential well in the CCD in FIG. 2. FIG. 4 is a time chart of the clock signals $\phi_1$, $\phi_2$ and $\phi_R$. The clock signal $\phi_R$ is applied to the transistors $Q_1$ and $Q_2$ in FIG. 2; however, different clock signals may be applied thereto.

In FIG. 1, at the time instant $t_1$ the transistors $Q_1$ and $Q_2$ are conductive (on), and therefore the output voltages $V_{FO}$ and $V_{FG}$ of the output circuit are equal to $V_O$ and $V_T$, respectively ($V_{FO}=V_O$, and $V_{FG}=V_T$). In this operation, the charges at the floating gate 7 are transferred to the next stage, and no charges are present at the floating gate 7. In FIG. 2, reference character $V_T$ designates a reset voltage which is essential for transferring charges. The voltage is set to a most suitable value in order to smoothly transfer ($t=t_2$) charges from the preceding state and transfer ($t=t_1$) charges to the following stage. Further in FIG. 2, reference character $V_O$ designates an output DC voltage which is determined completely irrespective of the reset voltage $V_T$.

At the time instant $t_2$, the transistors $Q_1$ and $Q_2$ are rendered non-conductive (off), and an amount of charge $Q_n$ is transferred to the floating gage 7. The amount of charge $Q_n$ is induced at one terminal of the capacitor $C_O$ through the oxide film capacitor $C_{OX}$ between the gate and the substrate and the capacitor $C_C$. Therefore, the output voltage $V_{FO}$ is changed as much as $Q_n/C_O$. Therefore, $$V_{FO}=V_O+Q_n/C_O$$

In the example, $Q_n<0$ because of the N channel CCD. The conversion gain of the transferred charges with respect to the output voltage is $1/C_O$, thus being determined by only $C_O$.

Figure 5:
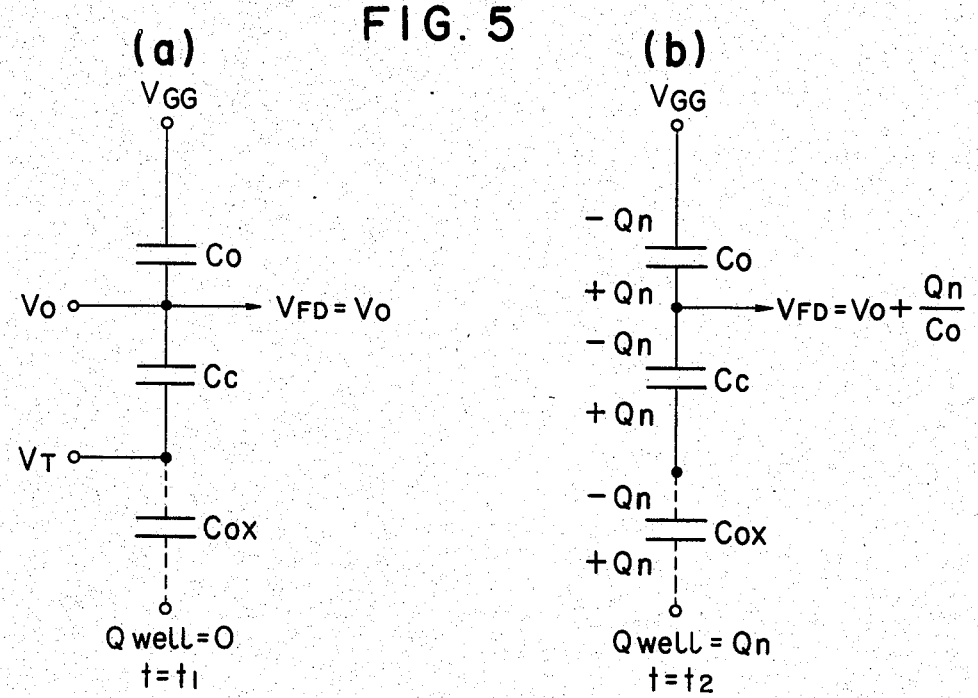
FIG. 5 is an equivalent circuit diagram for a description of variations of output voltages in the circuit in FIG. 2.

The parts (a) and (b) of FIG. 5 are explanatory diagrams which equivalently show variations of the output voltage $V_{FD}$ at the time instants $t_1$ and $t_2$, respectively. Thus, the output DC voltage $V_O$ and the reset voltage $V_T$ of the output circuit can be completely independently determined, and the charge-voltage conversion gain ($1/C_O$) can be independently determined.

Figure 6:
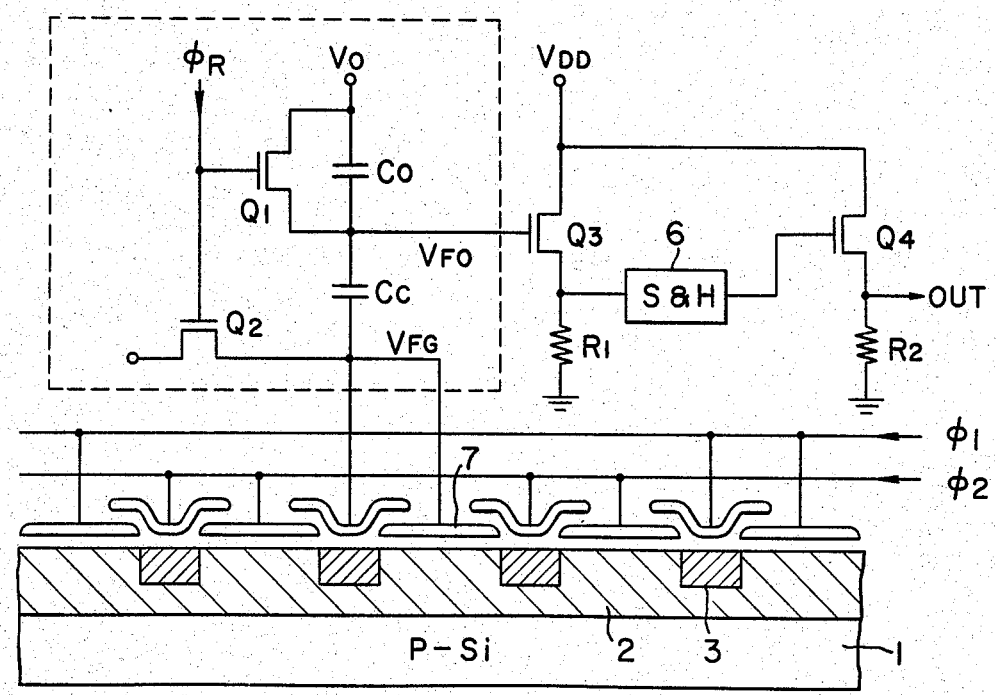
FIGS. 6 and 7 are explanatory diagrams showing second and third examples of the CCD output circuit according to the invention.

A second example of the CCD output circuit of the invention is as shown in FIG. 6. The second example can be obtained by modifying the first example in FIG. 2 in such a manner that the power source $V_{GG}$ is equal to the output DC voltage $V_O$. It is not always necessary that the power source $V_{GG}$ provides a fixed voltage, and therefore the output DC voltage $V_O$ can be employed instead of the power source $V_{GG}$.

Figure 7:
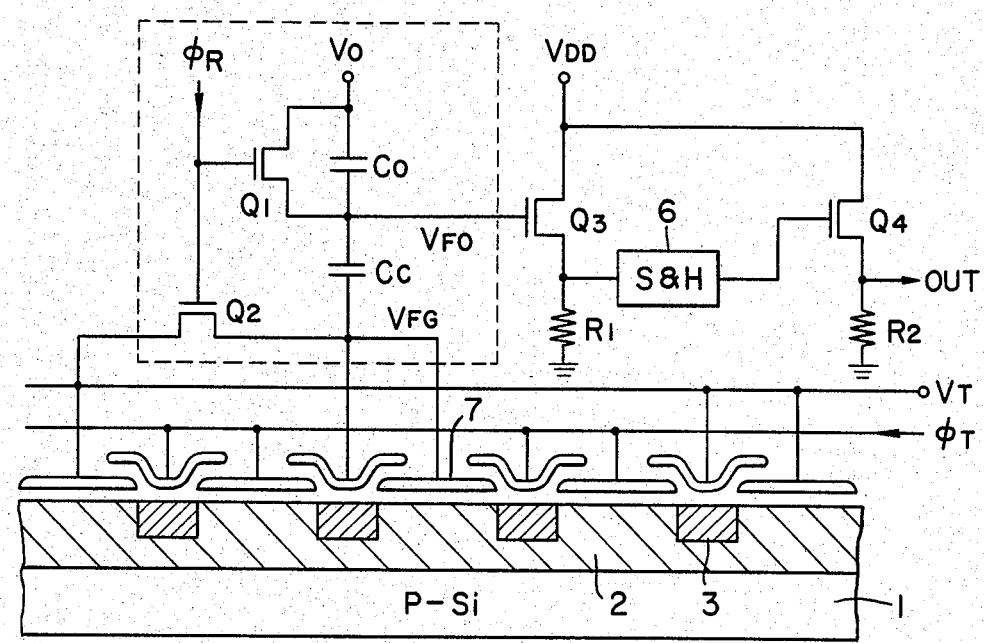
Figure 8:
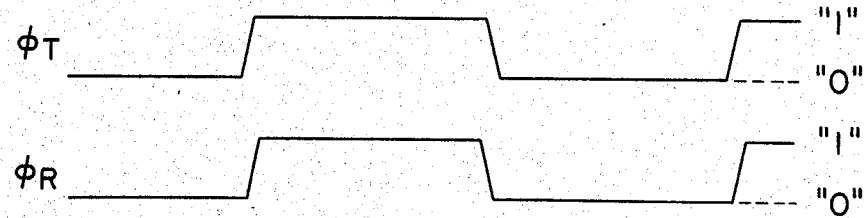
FIG. 8 is a time chart showing clock signals in the CCD output circuit in FIG. 7.

A third example of the CCD output circuit of the invention is as shown in FIG. 7, in which the technical concept of the invention is applied to a single phase drive CCD. In the third example, the clock signals $\phi_1$ and $\phi_2$ in the second example (FIG. 6) are replaced by the reset voltage $V_T$ and a clock signal $\phi_T$, respectively. The timing of the clock signal $\phi_T$ and the reset voltage $V_T$ is as shown in FIG. 8.

FIG. 9 shows a fourth example of the CCD output circuit according to the invention. The fourth example is obtained by modifying the third example in FIG. 7 in such a manner that among the floating gates, only the transferring floating gate is connected directly to the reset voltage $V_T$. The operation is substantially similar to that of the third example in FIG. 7.

As is apparent from the above description, according to the invention, the floating gate potential is detected through capacitance without using operational amplifiers, and therefore the signal band handled by the output circuit is increased to a high frequency band.

Furthermore, according to the invention, the output DC voltage of the output circuit can be set completely independently of the CCD floating gate reset voltage, and therefore, the output signal of the output circuit can be readily processed.

In addition, according to the invention, the charge-voltage conversion gain is less variable because it is determined only the capacitance instead of the output DC voltage.

What is claimed is:

1. A charge-coupled device output circuit for detecting an output signal from an amount of charges accumulated below a floating gate electrode; in which said floating gate electrode is connected in series to a first potential level ($V_{GG}$) point through first and second capacitors, a first connecting point of said floating gate electrode and said first capacitor is connected to a second potential level ($V_T$) point through a first control switch which is driven by a first reset clock pulse ($\phi_{R1}$), and a second connecting point of said first and second capacitors is connected to a third potential level ($V_O$) point through a second control switch which is driven by a second reset clock pulse ($\phi_{R2}$), to detect said output signal at said second connecting point.

2. A charge-coupled device output circuit as claimed in claim 1, in which said first potential level ($V_{GG}$) point is commonly connected to said third potential level ($V_O$) point.

3. A charge-coupled device output circuit as claimed in claim 1, in which said first reset clock pulse is equal to said second reset clock pulse.

4. A charge-coupled device output circuit as claimed in claim 2, in which said first reset clock pulse is equal to said second reset clock pulse.

* * * * *